(12) United States Patent
Huang et al.

(10) Patent No.: US 11,860,489 B2
(45) Date of Patent: Jan. 2, 2024

(54) SHORTING BAR AND MANUFACTURING METHOD THEREOF, ARRAY SUBSTRATE, AND DISPLAY DEVICE

(71) Applicant: HKC Corporation Limited, Shenzhen (CN)

(72) Inventors: Shishuai Huang, Shenzhen (CN); Wei Li, Shenzhen (CN)

(73) Assignee: HKC Corporation Limited, Shenzhen (CN)

( * ) Notice: Subject to any disclaimer, the term of this patent is extended or adjusted under 35 U.S.C. 154(b) by 127 days.

(21) Appl. No.: 17/370,360

(22) Filed: Jul. 8, 2021

(65) Prior Publication Data

US 2022/0026754 A1   Jan. 27, 2022

(30) Foreign Application Priority Data

Jul. 27, 2020   (CN) .......................... 202010729437.4

(51) Int. Cl.
| | |
|---|---|
| *G02F 1/1345* | (2006.01) |
| *G09G 3/00* | (2006.01) |
| *G02F 1/1362* | (2006.01) |
| *H01L 27/12* | (2006.01) |
| *H01L 25/00* | (2006.01) |

(52) U.S. Cl.
CPC .... *G02F 1/13452* (2013.01); *G02F 1/136272* (2021.01); *G02F 1/136295* (2021.01); *G09G 3/006* (2013.01); *H01L 25/50* (2013.01); *H01L 27/124* (2013.01); *G02F 2201/50* (2013.01)

(58) Field of Classification Search
None
See application file for complete search history.

(56) References Cited

U.S. PATENT DOCUMENTS

| | | | | |
|---|---|---|---|---|
| 6,020,599 | A * | 2/2000 | Yeo ...................... | H01L 27/124 257/349 |
| 9,000,797 | B2 * | 4/2015 | Wen .................. | G02F 1/136259 324/760.02 |
| 2003/0117536 | A1 * | 6/2003 | Jeon .................. | G02F 1/136286 349/40 |

(Continued)

FOREIGN PATENT DOCUMENTS

| | | |
|---|---|---|
| CN | 101846858 A | 9/2010 |
| CN | 202917490 U | 5/2013 |
| CN | 109599031 A | 4/2019 |

*Primary Examiner* — Ryan Crockett

(74) *Attorney, Agent, or Firm* — Franklin & Associates International Inc; Matthew F. Lambrinos

(57) ABSTRACT

The shorting bar includes a test signal wiring layer, an insulating layer, a signal lead layer, a protective layer and a bonding lead layer that are sequentially stacked. The test signal wiring layer is arranged with test signal lines, and the signal lead layer is arranged with signal leads. The test signal lines are made of a transparent conductive material, and a coverage region of the insulating layer and a coverage region of the protective layer are staggered from coverage regions of the test signal lines; or, the signal leads are made of the transparent conductive material, the coverage region of the protective layer is staggered from coverage regions of the signal leads; or, the protective layer is arranged with a plurality of first through holes, and the first through holes correspond to the signal leads in a one-to-one correspondence.

13 Claims, 5 Drawing Sheets

(56) References Cited

U.S. PATENT DOCUMENTS

| | | | |
|---|---|---|---|
| 2006/0067143 A1* | 3/2006 | Kim | H01L 27/124 365/201 |
| 2007/0020836 A1* | 1/2007 | Moon | H01L 27/124 438/198 |
| 2010/0066968 A1* | 3/2010 | Yoon | G02F 1/1309 349/149 |
| 2013/0057799 A1* | 3/2013 | Zhuang | G02F 1/13452 349/54 |
| 2015/0187801 A1* | 7/2015 | Xu | H01L 27/0288 257/48 |
| 2016/0118421 A1* | 4/2016 | Xu | H01L 29/401 438/618 |
| 2016/0324470 A1* | 11/2016 | Townsend | G06F 1/1679 |
| 2018/0294291 A1* | 10/2018 | Wei | H10K 59/131 |
| 2019/0064256 A1* | 2/2019 | Wang | G01R 31/2843 |
| 2020/0168632 A1* | 5/2020 | Huang | G02F 1/13439 |
| 2020/0194470 A1* | 6/2020 | Wang | H01L 27/1259 |
| 2022/0190380 A1* | 6/2022 | Hirakawa | H01M 10/05 |

* cited by examiner

| Depositing a indium tin oxide ITO transparent conductive film on a substrate by using magnetron sputtering, and then forming the odd-numbered data wirings 110 and the even-numbered data wirings 120 through a patterning process, that is, through coating photoresist, exposing and developing, and then wet etching and stripping. | S510 |

↓

| Depositing a silicon nitride (SiNx) or silicon oxide (SiOx) layer on the substrate on which the odd-numbered data wirings 110 and the even-numbered data wirings 120 are formed, to form an insulating layer 200. The coverage region of the insulating layer 200 and the coverage region of the protective layer 400 do not overlap with the coverage regions of the test signal lines. | S520 |

↓

| Depositing a metal layer on the substrate on which the insulating layer 200 is formed, performing photoresist coating and mask exposure, and then forming the first leads 310 and the second leads 320 by etching. | S530 |

↓

| Depositing a silicon nitride (SiNx) or silicon oxide (SiOx) layer on the substrate on which the first leads 310 and the second leads 320 are formed to form a protective layer 400. | S540 |

↓

| Depositing a metal layer on the substrate on which the protective layer 400 is formed, and performing photoresist coating and mask exposure to form the bonding lead layer 500. | S550 |

FIG. 5

SHORTING BAR AND MANUFACTURING METHOD THEREOF, ARRAY SUBSTRATE, AND DISPLAY DEVICE

CROSS REFERENCE TO RELATED APPLICATION

This application claims the benefit of Chinese Patent Application No. 202010729437.4, entitled "SHORTING BAR AND MANUFACTURING METHOD THEREOF, ARRAY SUBSTRATE, AND DISPLAY DEVICE", filed on Jul. 27, 2020, the entire content of which is incorporated herein in its entirety.

TECHNICAL FIELD

The present disclosure relates to the field of liquid crystal display technology, in particular to a shorting bar and a manufacturing method thereof, an array substrate and a display device.

BACKGROUND

During the manufacturing process of the display panel, a plurality of testing procedures is required. One important testing procedure thereof is to perform a light-on test by lighting on before performing Chip-On-Film packaging. After the test is completed, the signal lead between the shorting bar and the test signal line needs to be disconnected by laser cutting.

However, during the process of laser cutting, metal debris will accumulate at the fracture location of the metal. Once the metal debris accumulates too much, the problem of short circuit between two adjacent signal leads will occur, which will cause abnormal display of the panel and reduce the yield of the display panel.

SUMMARY

Based on this, it is necessary to provide a shorting bar and a manufacturing method thereof, an array substrate and a display device to address the problem of poor display caused by laser cutting.

An embodiment of the present disclosure provides a shorting bar. The shorting bar includes a test signal wiring layer, an insulating layer, a signal lead layer, a protective layer and a bonding lead layer that are sequentially stacked. The test signal wiring layer is arranged with test signal lines, and the signal lead layer is arranged with signal leads;

wherein, the test signal lines are made of a transparent conductive material, and a coverage region of the insulating layer and a coverage region of the protective layer are staggered from coverage regions of the test signal lines; or, the signal leads are made of the transparent conductive material, the coverage region of the protective layer is staggered from coverage regions of the signal leads; or, the protective layer is arranged with a plurality of first through holes, and the first through holes correspond to the signal leads in a one-to-one correspondence, and are located directly above the signal leads, and the first through holes are filled with the transparent conductive material so that the signal leads can be disconnected by acid pickling.

In one of the embodiments, the transparent conductive material is an indium tin oxide material.

In one of the embodiments, a cross-section of the first through hole has a shape of rectangle or orthogon.

In one of the embodiments, the test signal lines includes odd-numbered data wirings and even-numbered data wirings arranged at intervals; and the signal leads include first leads and second leads arranged at intervals, the first leads are electrically connected to the first test signal lines, and the second leads are electrically connected to the second test signal lines.

In one of the embodiments, the first leads and the second leads are alternately arranged in sequence.

Based on the same inventive concept, an embodiment of the present disclosure further provides a manufacturing method of a shorting bar, which includes:

forming a test signal wiring layer on a substrate;
forming an insulating layer on the substrate on which the test signal wiring layer is formed;
forming a signal lead layer on the substrate on which the insulating layer is formed;
forming a protective layer on the substrate on which the signal lead layer is formed; and
forming a bonding lead layer on the substrate on which the protective layer is formed;

wherein, the test signal lines are made of a transparent conductive material, and a coverage region of the insulating layer and a coverage region of the protective layer are staggered from coverage regions of the test signal lines; or, the signal leads are made of the transparent conductive material, the coverage region of the protective layer is staggered from coverage regions of the signal leads; or, the protective layer is arranged with a plurality of first through holes, and the first through holes correspond to the signal leads in a one-to-one correspondence, and are located directly above the signal leads, and the first through holes are filled with the transparent conductive material so that the signal leads can be disconnected by acid pickling.

In one of the embodiments, the transparent conductive material is a copper indium gallium selenide material, a copper indium selenide material, a cadmium telluride material or a gallium arsenide material.

In one of the embodiments, a cross-section of the first through hole has a shape of rectangle or orthogon.

Based on the same inventive concept, an embodiment of the present disclosure further provides an array substrate. The array substrate includes a display region and a non-display region, the non-display region includes a test region, and the shorting bar of any of the above described embodiments is arranged in the test region.

Based on the same inventive concept, an embodiment of the present disclosure further provides a display device including the above described array substrate.

In summary, the embodiments of the present disclosure provide a shorting bar and a manufacturing method thereof, an array substrate and a display device. The shorting bar includes a test signal wiring layer, an insulating layer, a signal lead layer, a protective layer and a bonding lead layer that are sequentially stacked. The test signal wiring layer is arranged with test signal lines, and the signal lead layer is arranged with signal leads. The test signal lines are made of a transparent conductive material, and a coverage region of the insulating layer and a coverage region of the protective layer are staggered from coverage regions of the test signal lines; or, the signal leads are made of the transparent conductive material, the coverage region of the protective layer is staggered from coverage regions of the signal leads; or, the protective layer is arranged with a plurality of first through holes, and the first through holes correspond to the signal leads in a one-to-one correspondence, and are located directly above the signal leads, and the first through holes are filled with the transparent conductive material so that the signal leads can be disconnected by acid pickling. In the present disclosure, when the test signal lines are made of a transparent conductive material, and the coverage region of the insulating layer and the coverage region of the protective layer are staggered from the coverage regions of the test signal lines, after the light-on test is completed, the test signal lines can be washed off by acid pickling, thereby achieving the purpose of disconnection. Or, when the signal leads are made of the transparent conductive material, and the coverage region of the protective layer is staggered from the coverage regions of the signal leads, after the light-on test is completed, the signal leads are washed off by acid pickling, such that the connection between the test signal lines and the binding area is disconnected, thereby achieving the purpose of disconnection. Or, a plurality of first through holes is arranged in the protective layer, the first through holes correspond to the signal leads in a one-to-one correspondence, a length of the first through holes in a direction perpendicular to an extending direction of the signal leads is not less than a width of the signal leads, and the first through holes are filled with the transparent conductive material. After the light-on test is completed, the transparent conductive material filled in the first through holes and the signal leads in the coverage regions of the first through holes are washed off by acid pickling, thereby achieving the purpose of disconnection. Moreover, the way of using acid pickling to achieve the purpose of disconnection, will not cause metal accumulation, thus the problem of short circuit between two adjacent signal leads caused by laser cutting is avoided, and the yield of the panel is improved.

BRIEF DESCRIPTION OF THE DRAWINGS

FIG. 5 is a flow chart of a manufacturing method of a shorting bar provided by an embodiment of the present disclosure.

DETAILED DESCRIPTION

Figure 1:
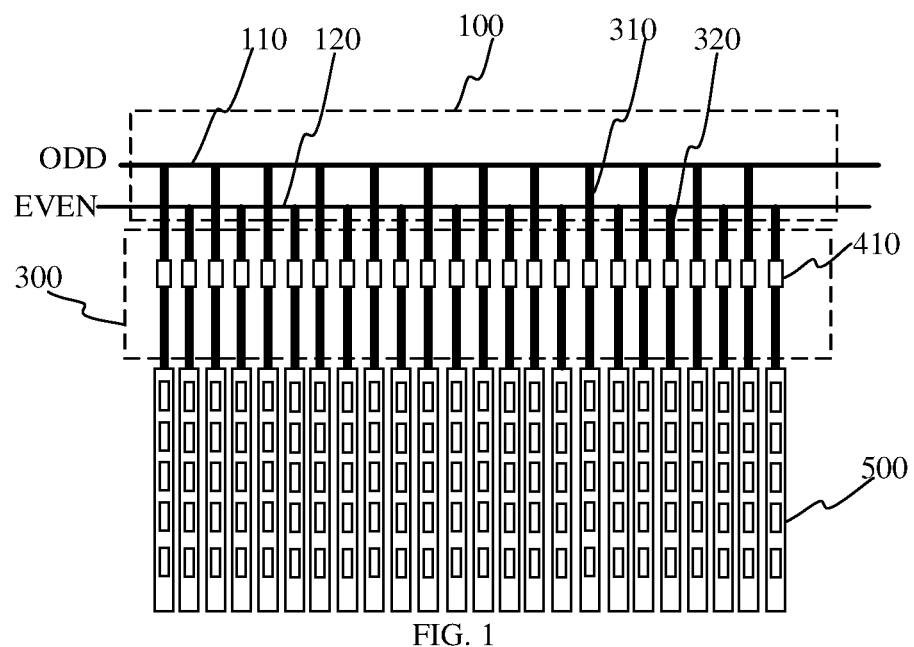
FIG. 1 is a schematic plane structure diagram of a shorting bar provided by an embodiment of the present disclosure.
Figure 2:
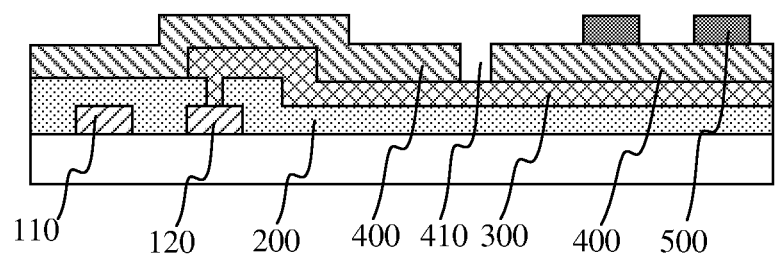
FIG. 2 is a schematic cross-sectional structure diagram of the shorting bar shown in FIG. 1.
Figure 3:
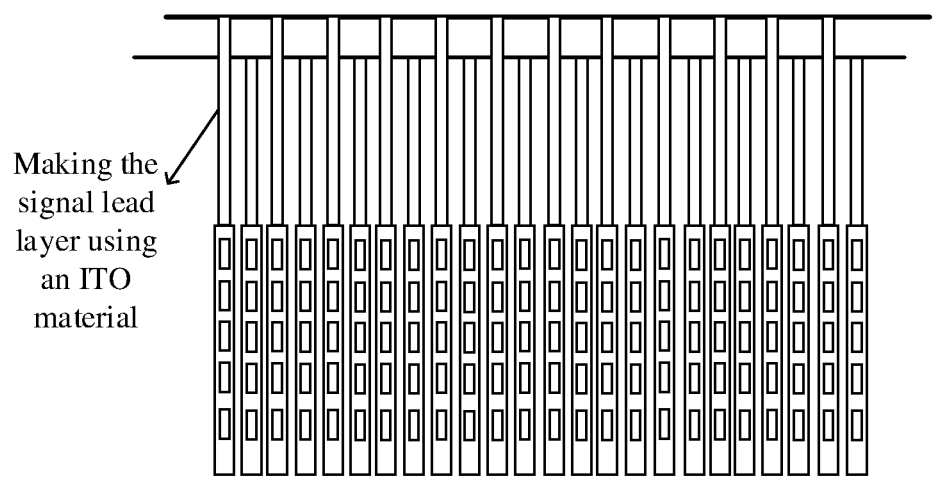
FIG. 3 is a schematic plane structure diagram of another shorting bar provided by an embodiment of the present disclosure.
Figure 4:
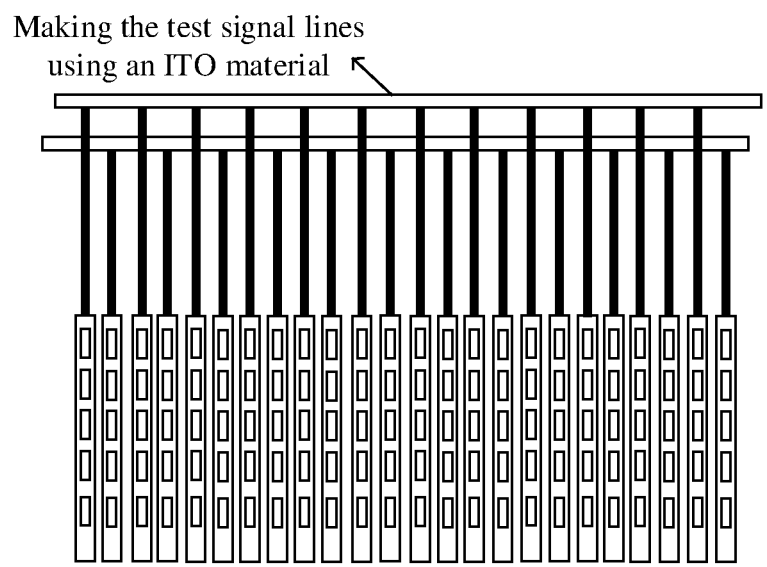
FIG. 4 is a schematic plane structure diagram of yet another shorting bar provided by an embodiment of the present disclosure.

The above objects, features, and advantages of the present disclosure will become more apparent by describing in detail embodiments thereof with reference to the accompanying drawings. In the following description, numerous specific details are set forth in order to provide a thorough understanding of the present disclosure. However, the present disclosure can be implemented in many other ways which are different from those described herein, and those skilled in the art can make similar improvements without departing from the essence of the present disclosure. Therefore, the present disclosure is not limited by the specific embodiments disclosed below.

Referring to FIG. 1, FIG. 2, FIG. 3 and FIG. 4, an embodiment of the present disclosure provides a shorting bar. The shorting bar includes a test signal wiring layer 100, an insulating layer 200, a signal lead layer 300, a protective layer 400 and a bonding lead layer 500 that are sequentially stacked. The test signal wiring layer 100 is arranged with test signal lines, and the signal lead layer 300 is arranged with signal leads.

The test signal lines are made of a transparent conductive material, and a coverage region of the insulating layer 200 and a coverage region of the protective layer 400 are staggered from (that is, do not overlap) coverage regions of the test signal lines; or, the signal leads are made of the transparent conductive material, the coverage region of the protective layer 400 is staggered from (that is, does not overlap) coverage regions of the signal leads; or, the protective layer 400 is arranged with a plurality of first through holes 410, and the first through holes 410 correspond to the signal leads in a one-to-one correspondence, and are located directly above the signal leads, and the first through holes 410 are filled with the transparent conductive material so that the signal leads can be disconnected by acid pickling.

It can be understood that the test signal lines and the bonding lead layer 500 are electrically connected through the signal leads. After the light-on test is completed, in order to prevent the data signals on the bonding (bonding area), that is, on the bonding lead layer 500, flow back onto the test signal lines, it is required to disconnect the connection between the test signal lines and the bonding area. In this embodiment, by changing the material of the test signal lines, that is, the test signal lines are made of a transparent conductive material, while ensuring that the coverage region of the insulating layer 200 and the coverage region of the protective layer 400 are staggered from (that is, do not overlap) the coverage regions of the test signal lines, after the light-on test is completed, the test signal lines can be washed off by acid pickling, thereby achieving the purpose of disconnection. Or, by changing the material of the signal leads, that is, the signal leads are made of the transparent conductive material, while ensuring that the coverage region of the protective layer 400 is staggered from (that is, does not overlap) the coverage regions of the signal leads, after the light-on test is completed, the signal leads are washed off by acid pickling, such that the connection between the test signal lines and the binding area is disconnected, thereby achieving the purpose of disconnection. Or, by providing a plurality of first through holes 410 in the protective layer 400, the first through holes 410 correspond to the signal leads in a one-to-one correspondence, and are located directly above the signal leads, and the first through holes 410 are filled with the transparent conductive material, after the light-on test is completed, the transparent conductive material filled in the first through holes 410 and the signal leads in the coverage regions of the first through holes 410 are washed off by acid pickling, thereby achieving the purpose of disconnection. That is, in the present disclosure, the test signal lines, the signal leads, the transparent conductive material in the first through holes 410, and the signal leads in coverage regions of the first through holes 410 can be washed off by acid pickling to achieve the purpose of disconnection. Moreover, the way of using acid pickling to achieve the purpose of disconnection, will not cause metal accumulation, thus the problem of short circuit between two adjacent signal leads caused by laser cutting is avoided, and the yield of the panel is improved.

In one of the embodiments, the transparent conductive material is an Indium Tin Oxide (ITO) material. It can be understood that the indium tin oxide material has good conductivity and stability, and is easily soluble in acidic liquids. Therefore, as the indium tin oxide material is used to make the test signal lines and the signal leads, and the indium tin oxide material is used to fill the first through holes 410, after the light-on test is completed, the test signal lines, the signal leads, the fillings in the first through holes 410, and the signal leads in the coverage regions of the first through holes 410 can be washed off by acid pickling, thereby achieving the purpose of disconnection, with no need to use laser to cut the signal leads.

In one of the embodiments, a cross-section of the first through hole 410 has a shape of rectangle or orthogon. In this embodiment, since the cross-section of the first through hole 410 has a shape of rectangle or orthogon, a vertical distance between two disconnected surfaces can be kept consistent to the greatest extent, preventing the possibility of connection between the disconnected surfaces, thereby improving the yield of the display panel.

In one of the embodiments, the test signal lines include odd-numbered data wirings 110 and even-numbered data wirings 120 arranged at intervals; the signal leads include first leads 310 and second leads 320 arranged at intervals, the first leads 310 are electrically connected to the first test signal lines, and the second leads 320 are electrically connected to the second test signal lines. In this embodiment, data signals are injected from outside through the odd-numbered data wirings 110 and the even-numbered data wirings 120, and then the data signals are provided to two electrodes of the thin film transistors to be tested through the first leads 310 and the second leads 320, so as to provide data signals for the thin film transistors to be tested. The insulating layer 200 is arranged with second through holes and third through holes, the first leads 310 and the first test signal lines are electrically connected through the second through holes, and the second leads 320 and the second test signal lines are electrically connected through the third through holes.

In one of the embodiments, the first leads 310 and the second leads 320 are alternately arranged in sequence. It can be understood that the first leads 310 and the second leads 320 are alternately arranged in sequence to prevent the first leads 310 and the second leads 320 from crossing each other, which is beneficial to save wiring space and reduce the complexity of wiring.

Based on the same inventive concept, an embodiment of the present disclosure further provides a manufacturing method of a shorting bar, which includes:

Forming a test signal wiring layer 100 on a substrate;

forming an insulating layer 200 on the substrate on which the test signal wiring layer 100 is formed;

forming a signal lead layer 300 on the substrate on which the insulating layer 200 is formed;

forming a protective layer 400 on the substrate on which the signal lead layer 300 is formed; and forming a bonding lead layer 500 on the substrate on which the protective layer 400 is formed.

The test signal lines are made of a transparent conductive material, and a coverage region of the insulating layer 200 and a coverage region of the protective layer 400 are staggered from (that is, do not overlap) coverage regions of the test signal lines; or, the signal leads are made of the transparent conductive material, the coverage region of the protective layer 400 is staggered from (that is, does not overlap) coverage regions of the signal leads; or, the protective layer 400 is arranged with a plurality of first through holes 410, and the first through holes 410 correspond to the signal leads in a one-to-one correspondence, and are located directly above the signal leads, and the first through holes 410 are filled with the transparent conductive material so that the signal leads can be disconnected by acid pickling.

In one of the embodiments, the transparent conductive material is an indium tin oxide material. It can be understood that the indium tin oxide material has good conductivity and stability, and is easily soluble in acidic liquids. Therefore, as the indium tin oxide material is used to make the test signal lines and the signal leads, and the indium tin oxide material is used to fill the first through holes 410, after the light-on test is completed, the test signal lines, the signal leads, the fillings in the first through holes 410, and the signal leads in the coverage regions of the first through holes 410 can be washed off by acid pickling, thereby achieving the purpose of disconnection, with no need to use laser to cut the signal leads.

In one of the embodiments, a cross-section of the first through hole 410 has a shape of rectangle or orthogon. In this embodiment, since the cross-section of the first through hole 410 has a shape of rectangle or orthogon, a vertical distance between two disconnected surfaces can be kept consistent to the greatest extent, preventing the possibility of connection between the disconnected surfaces, thereby improving the yield of the display panel.

Referring to FIG. 5, in one of the embodiments, the test signal lines include odd-numbered data wirings 110 and even-numbered data wirings 120 arranged at intervals; the signal leads include first leads 310 and second leads 320 arranged at intervals, the first leads 310 are electrically connected to the first test signal lines, and the second leads 320 are electrically connected to the second test signal lines. For the shorting bar which uses a transparent conductive material to make the test signal wiring layer 100, its manufacturing process specifically includes:

Step S510, depositing a indium tin oxide ITO transparent conductive film on a substrate by using magnetron sputtering, and then forming the odd-numbered data wirings 110 and the even-numbered data wirings 120 through a patterning process, that is, through coating photoresist, exposing and developing, and then wet etching and stripping.

Step S520, depositing a silicon nitride (SiNx) or silicon oxide (SiOx) layer on the substrate on which the odd-numbered data wirings 110 and the even-numbered data wirings 120 are formed, to form an insulating layer 200. The coverage region of the insulating layer 200 and the coverage region of the protective layer 400 are staggered from (that is, do not overlap) the coverage regions of the test signal lines.

Step S530, depositing a metal layer on the substrate on which the insulating layer 200 is formed, performing photoresist coating and mask exposure, and then forming the first leads 310 and the second leads 320 by etching.

Step S540, depositing a silicon nitride (SiNx) or silicon oxide (SiOx) layer on the substrate on which the first leads 310 and the second leads 320 are formed to form a protective layer 400.

Step S550, depositing a metal layer on the substrate on which the protective layer 400 is formed, and performing photoresist coating and mask exposure to form the bonding lead layer 500.

Figure 6:
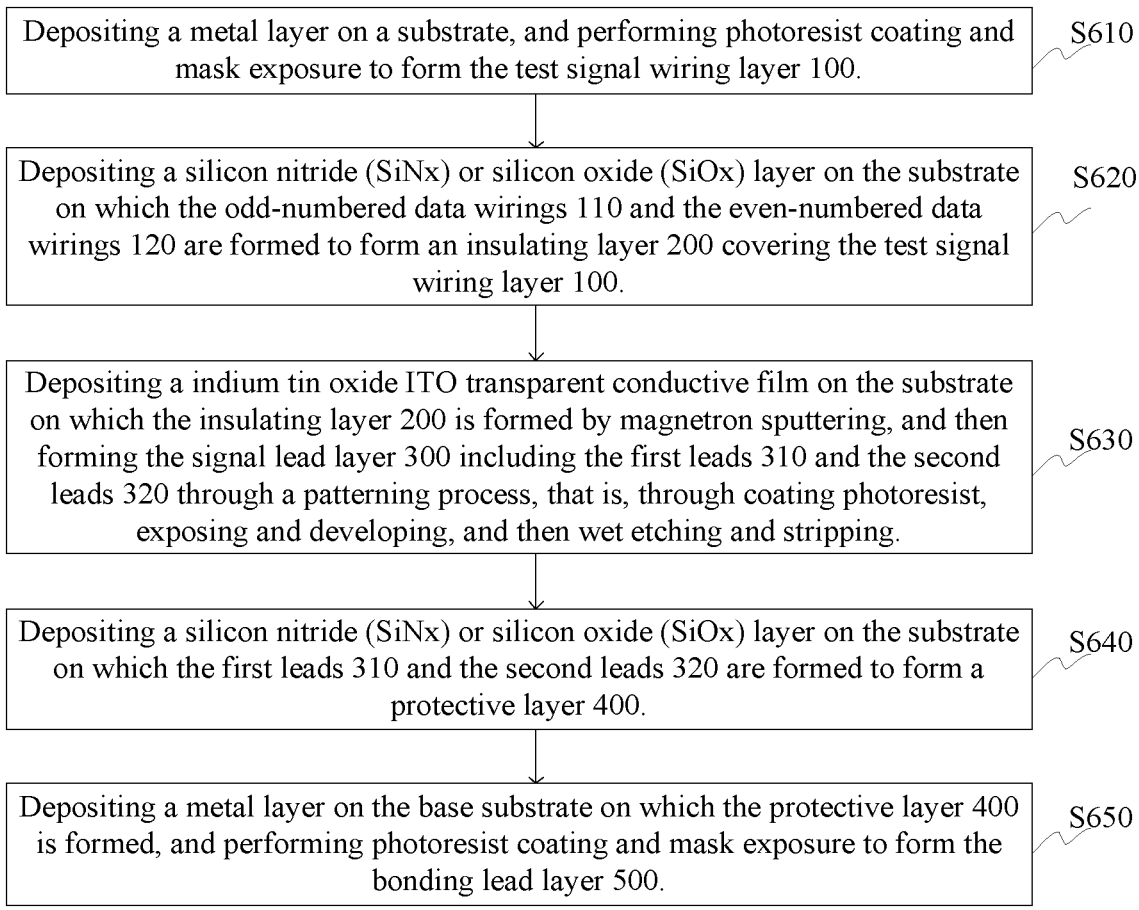
FIG. 6 is a flow chart of another manufacturing method of a shorting bar provided by an embodiment of the present disclosure.

Referring to FIG. 6, in one of the embodiments, for the shorting bar which uses a transparent conductive material to make the signal lead layer 300, its manufacturing process specifically includes:

Step S610, depositing a metal layer on a substrate, and performing photoresist coating and mask exposure to form the test signal wiring layer 100.

Step S620, depositing a silicon nitride (SiNx) or silicon oxide (SiOx) layer on the substrate on which the odd-numbered data wirings 110 and the even-numbered data wirings 120 are formed to form an insulating layer 200 covering the test signal wiring layer 100.

Step S630, depositing a indium tin oxide ITO transparent conductive film on the substrate on which the insulating layer 200 is formed by magnetron sputtering, and then forming the signal lead layer 300 including the first leads 310 and the second leads 320 through a patterning process, that is, through coating photoresist, exposing and developing, and then wet etching and stripping.

Step S640, depositing a silicon nitride (SiNx) or silicon oxide (SiOx) layer on the substrate on which the first leads 310 and the second leads 320 are formed to form a protective layer 400.

Step S650, depositing a metal layer on the substrate on which the protective layer 400 is formed, and performing photoresist coating and mask exposure to form the bonding lead layer 500.

Figure 7:
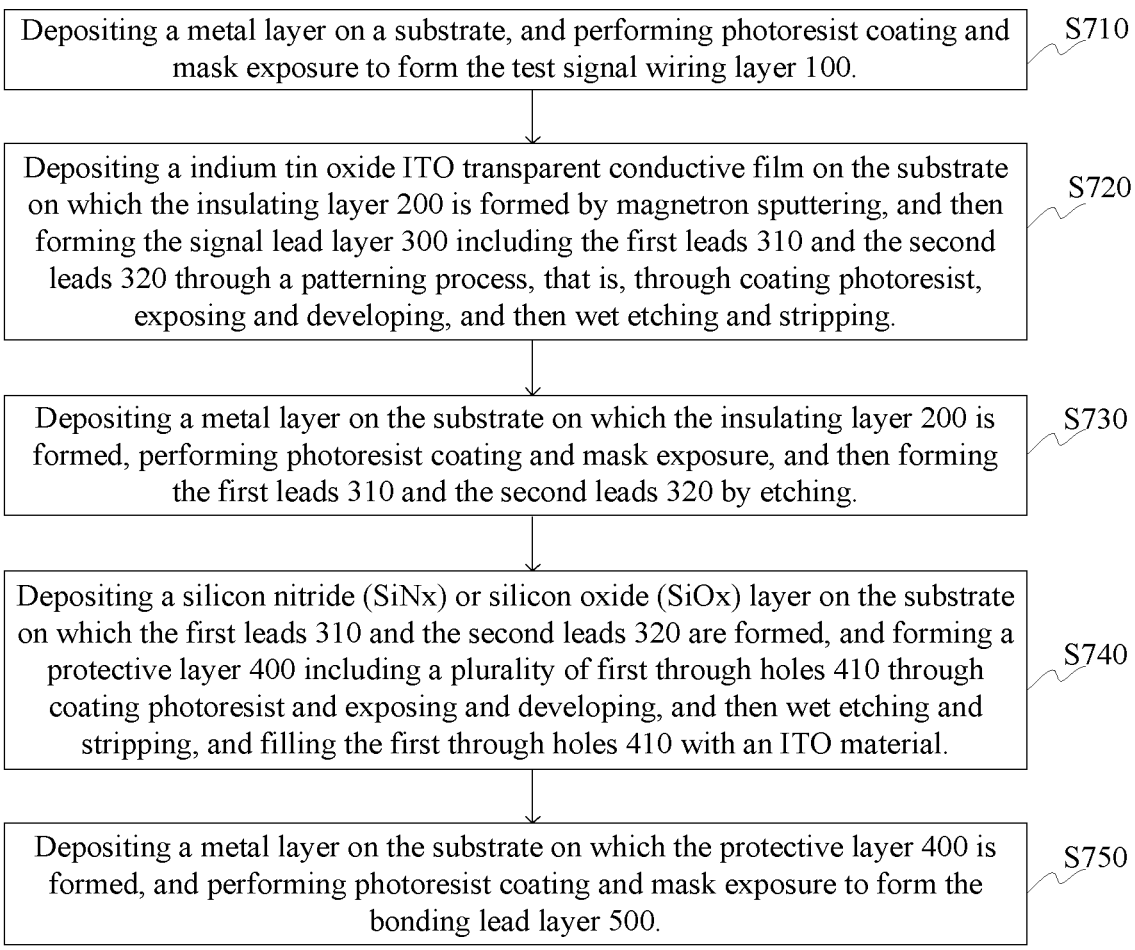
FIG. 7 is a flow chart of yet another manufacturing method of a shorting bar provided by an embodiment of the present disclosure.

Referring to FIG. 7, in one of the embodiments, for the shorting bar which uses a transparent conductive material to fill the first through holes 410, its manufacturing process specifically includes:

Step S710, depositing a metal layer on a substrate, and performing photoresist coating and mask exposure to form the test signal wiring layer 100.

Step S720, depositing a indium tin oxide ITO transparent conductive film on the substrate on which the insulating layer 200 is formed by magnetron sputtering, and then forming the signal lead layer 300 including the first leads 310 and the second leads 320 through a patterning process, that is, through coating photoresist, exposing and developing, and then wet etching and stripping.

Step S730, depositing a metal layer on the substrate on which the insulating layer 200 is formed, performing photoresist coating and mask exposure, and then forming the first leads 310 and the second leads 320 by etching.

Step S740, depositing a silicon nitride (SiNx) or silicon oxide (SiOx) layer on the substrate on which the first leads 310 and the second leads 320 are formed, and forming a protective layer 400 including a plurality of first through holes 410 through coating photoresist and exposing and developing, and then wet etching and stripping, and filling the first through holes 410 with an ITO material.

Step S750, depositing a metal layer on the substrate on which the protective layer 400 is formed, and performing photoresist coating and mask exposure to form the bonding lead layer 500.

Based on the same inventive concept, an embodiment of the present disclosure further provides an array substrate. The array substrate includes a display region and a non-display region, the non-display region includes a test region, and the shorting bar of any of the above described embodiments is arranged in the test region.

Based on the same inventive concept, an embodiment of the present disclosure further provides a display device including the above described array substrate. The display device may be any product or component with display function such as liquid crystal panel, electronic paper, OLED panel, mobile phone, tablet computer, television, monitor, notebook computer, digital photo frame, navigator, and the like.

In summary, in the embodiments of the present disclosure, when the test signal lines are made of a transparent conductive material, and the coverage region of the insulating layer 200 and the coverage region of the protective layer 400 are staggered from (that is, do not overlap) the coverage regions of the test signal lines, after the light-on test is completed, the test signal lines can be washed off by acid pickling, thereby achieving the purpose of disconnection. Or, when the signal leads are made of the transparent conductive material, and the coverage region of the protective layer 400 is staggered from (that is, does not overlap) the coverage regions of the signal leads, after the light-on test is completed, the signal leads are washed off by acid pickling, such that the connection between the test signal lines and the binding area is disconnected, thereby achieving the purpose of disconnection. Or, a plurality of first through holes 410 are arranged in the protective layer 400, the first through holes 410 correspond to the signal leads in a one-to-one correspondence, and the first through holes 410 are filled with the transparent conductive material. After the light-on test is completed, the transparent conductive material filled in the first through holes 410 and the signal leads in the coverage regions of the first through holes 410 are washed off by acid pickling, thereby achieving the purpose of disconnection. Moreover, the way of using acid pickling to achieve the purpose of disconnection, will not cause metal accumulation, thus the problem of short circuit between two adjacent signal leads caused by laser cutting is avoided, and the yield of the panel is improved.

The technical features of the above-described embodiments may be combined arbitrarily. To simplify the description, not all possible combinations of the technical features in the above embodiments are described. However, all of the combinations of these technical features should be considered as within the scope of this disclosure, as long as such combinations do not contradict with each other.

The above described embodiments are merely illustrate several embodiments of the present disclosure, which are described more specifically and in detail, but they cannot be understood as limiting the scope of the present disclosure. It should be noted that, for those ordinary skilled in the art, several variations and improvements may be made without departing from the concept of the present disclosure, and these are all within the protection scope of the present disclosure. Therefore, the protection scope of the present disclosure shall be subject to the appended claims.

What is claimed is:

1. A shorting bar, comprising a test signal wiring layer, an insulating layer, a signal lead layer, a protective layer and a bonding lead layer being sequentially stacked, the test signal wiring layer being arranged with test signal lines, and the signal lead layer being arranged with signal leads;

wherein the signal leads are made of the transparent conductive material, a coverage region of the protective layer does not overlap with coverage regions of the signal leads, so that a disconnection is between the test signal lines and a binding area by washing off the signal leads using acid pickling after a light-on test is completed.

2. The shorting bar according to claim 1, wherein the signal lead layer is between the insulating layer and the protective layer.

3. The shorting bar according to claim 1, wherein the transparent conductive material is an indium tin oxide material.

4. The shorting bar according to claim 1, wherein the transparent conductive material is a copper indium gallium selenide material, a copper indium selenide material, a cadmium telluride material or a gallium arsenide material.

5. The shorting bar according to claim 1, wherein the test signal lines comprise odd-numbered data wirings and even-numbered data wirings arranged at intervals; and the signal leads comprise first leads and second leads arranged at intervals, the first leads are electrically connected to the first test signal lines, and the second leads are electrically connected to the second test signal lines.

6. The shorting bar according to claim 5, wherein the first leads and the second leads are alternately arranged in sequence.

7. A manufacturing method of a shorting bar, comprising:
forming a test signal wiring layer on a substrate;
forming an insulating layer on the substrate on which the test signal wiring layer is formed;
forming a signal lead layer on the substrate on which the insulating layer is formed;
forming a protective layer on the substrate on which the signal lead layer is formed; and
forming a bonding lead layer on the substrate on which the protective layer is formed;
wherein signal leads are made of the transparent conductive material, a coverage region of the protective layer does not overlap with coverage regions of the signal leads, so that a disconnection is between test signal lines and a binding area by washing off the signal leads using acid pickling after a light-on test is completed.

8. The manufacturing method of the shorting bar according to claim 7, the transparent conductive material is an indium tin oxide material.

9. An array substrate, comprising a display region and a non-display region, the non-display region comprising a test region, and a shorting bar being arranged in the test region;

the shorting bar comprising a test signal wiring layer, an insulating layer, a signal lead layer, a protective layer and a bonding lead layer that are sequentially stacked, the test signal wiring layer being arranged with test signal lines, and the signal lead layer being arranged with signal leads;

wherein the signal leads are made of the transparent conductive material, a coverage region of the protective layer does not overlap with coverage regions of the signal leads, so that a disconnection is between the test signal lines and a binding area by washing off the signal leads using acid pickling after a light-on test is completed.

10. The array substrate according to claim 9, wherein the transparent conductive material is an indium tin oxide material.

11. The array substrate according to claim 9, wherein the transparent conductive material is a copper indium gallium selenide material, a copper indium selenide material, a cadmium telluride material or a gallium arsenide material.

12. The array substrate according to claim 9, wherein the test signal lines comprise odd-numbered data wirings and even-numbered data wirings arranged at intervals; and the signal leads comprise first leads and second leads arranged at intervals, the first leads are electrically connected to the first test signal lines, and the second leads are electrically connected to the second test signal lines.

13. The array substrate according to claim 12, wherein the first leads and the second leads are alternately arranged in sequence.

* * * * *